United States Patent [19]

Imanaka et al.

[11] Patent Number: 4,679,320
[45] Date of Patent: Jul. 14, 1987

[54] PROCESS FOR PRODUCING MULTILAYER CERAMIC CIRCUIT BOARD WITH COPPER

[75] Inventors: Yoshihiko Imanaka, Atsugi; Hiromi Ogawa, Yokohama; Mineharu Tsukada, Atsugi; Etsuro Udagawa, Atsugi; Kazuaki Kurihara, Atsugi; Hiromitsu Yokoyama, Sagamihara; Nobuo Kamehara, Isehara, all of Japan

[73] Assignee: Fujitsu Limited, Kawasaki, Japan

[21] Appl. No.: 801,783

[22] Filed: Nov. 26, 1985

[30] Foreign Application Priority Data

Dec. 28, 1984 [JP] Japan ................... 59-274534

[51] Int. Cl.$^4$ ............................... H01K 3/22
[52] U.S. Cl. ........................ 29/848; 29/840; 156/89
[58] Field of Search ............... 29/830, 848, 840, 851; 156/89; 264/61

[56] References Cited

U.S. PATENT DOCUMENTS

| | | | |
|---|---|---|---|
| 4,159,295 | 6/1979 | Mazzuchelli et al. | 264/61 X |
| 4,234,367 | 11/1980 | Herron et al. | 156/89 |
| 4,345,955 | 8/1982 | Bakermans et al. | 156/89 |
| 4,413,061 | 11/1983 | Kumar et al. | 29/840 X |
| 4,465,727 | 8/1984 | Fujita et al. | 156/89 X |
| 4,504,339 | 3/1985 | Kamehara et al. | 156/89 |
| 4,510,000 | 4/1985 | Kumar et al. | 156/89 |

FOREIGN PATENT DOCUMENTS 51-127112 11/1976 Japan.
52-5523 2/1977 Japan.

OTHER PUBLICATIONS

IBM Tech Disclosure Bull, vol. 8. No. 10, Mar. 1966, pp. 1307–1308, by Ahn et al.
IBM Tech Disclosure Bull, vol. 12, No. 1, Jun. 1978, p. 171, by Miller.
IBM Tech Disclosure Bull, vol. 22, No. 4, Sep. 1979, p. 1542, by Master et al.

Primary Examiner—Howard N. Goldberg
Assistant Examiner—Carl J. Arbes
Attorney, Agent, or Firm—Staas & Halsey

[57] ABSTRACT

A process for producing a multilayer ceramic circuit board with copper including the steps of:

forming green sheets by doctoring a slurry which includes 100 parts by weight of glass ceramic particles, 5 to 20 parts by weight of a thermally depolymerizable resin binder, 2 to 10 parts by weight of a plasticizer, and up to 2 parts by weight of a fatty acid ethylene oxide adduct type, deflorculant. The glass ceramic includes 20 to 70% by weight of alumina, and 30 to 80% by weight of $SiO_2$-$B_2O_3$ glass. The process further includes the steps of forming via holes through the green sheets, screen-printing a copper paste on the green sheets, and laminating the green sheets, thereby forming a multilayer structure and firing the multilayer structure in a non-oxidizable atmosphere.

7 Claims, 11 Drawing Figures

PROCESS FOR PRODUCING MULTILAYER CERAMIC CIRCUIT BOARD WITH COPPER

BACKGROUND OF THE INVENTION

1. Field of the Invention

The present invention relates to a process for producing a multilayer ceramic circuit board with copper, which comprises a glass-ceramic insulator having a low dielectric constant and a conductor having a low electrical resistance.

2. Description of the Related Art

Multilayer ceramic circuit boards have been produced by using either a high melting point metal such as molybdenum or tungsten, or a noble metal such as gold. Recently, it is desired to use copper as a conductor, because its electric resistance is lower than the former and its price is cheaper than the latter. The lower melting point of copper enables the use of a glass-ceramics having a softening point far lower than alumina. It is, of course, necessary to fire the glass-ceramics in an inert atmosphere in order to prevent oxidizing of the copper. On the other hand, it is desirable that the organic materials are completely burnt out without leaving residual carbon, which may derive from a binder resin, a plasticizer, a deflocculant, and a solvent. These organic materials bring the following improvements in the behavior of a ceramic slurry and green sheet:

(a) The solvent dissolves the other organic materials to distribute them uniformly in the slurry, to disperse the ceramic paricles in the slurry, and the solvent evaporates from the green sheet formed by doctoring the slurry and leaves micropores in the green sheet.

(b) The deflocculant forms a thin coating film on the surface of the ceramic particles, to distribute them uniformly in the formed slurry and stabilize their distribution due to the occurrence of steric hindrance and electric repulsion between the ceramic particles. Thus, it is possible to form a green sheet in which the ceramic particles are uniformly distributed without flocculation.

(c) The binder dissolves in the solvent and enhances its viscosity to form a thixotropic slurry. Thus, it is possible for the ceramic particles to bind with each other in a green sheet.

(d) The plasticizer structurally expands the binder and improves distribution of the binder in the slurry. Thus, it is possible to obtain a flexible green sheet.

Although these organic materials exhibit such desirable effects in forming a ceramic slurry and green sheet, one of them, i.e., a deflocculant, is sometimes eliminated in order to decrease the total amount of organic materials, thereby decreasing the residual carbon after firing.

Nakamura et Kamehara to Fujitsu Ltd., disclose in Japanese Examined Patent Publication No. 52-5523 to produce a ceramic board by firing a green sheet prepared from a ceramic slurry which comprises alumina particles, a deflocculant, i.e., sorbitan sesquioleate or sorbitan trioleate, a hydrophobic binder, and a plasticizer, first in normal atmosphere at 400° C. to 600° C. to eliminate the binder and then at 1300° C., and finally in a hydrogen atmosphere at 1600° C.

Honda to Fujitsu Ltd., discloses in Japanese Unexamined Patent Publication No. 51-127112 a process for producing a multilayer glass circuit board by laminating conductor paste-printed glass green sheets prepared from a glass slurry which comprises glass powder, a binder, e.g., polymethacrylate or polyvinylbutyral resin, a plasticizer, e.g., dioctyl phthalate, dibutyl phthalate, a deflocculant, e.g., nonyl phenol ethylene oxide adduct (registered trade name "Tergitol NPX" available from Union Carbide Ltd.), a solvent, e.g., methyl ethyl ketone and other adduct, e.g., polyethylene glycol; prefiring the laminated structure at about 500° C. in a reducing atmosphere, and then firing the structure in vacuum.

Tormey et al reports in MIT Industrial Liaison Program Report 6-15-84, 1984 to use a fish oil or glycerol trioleate as a deflocculant in a ceramic slurry.

Herron et al to IBM Ltd., disclose in U.S. Pat. No. 4,234,367 to produce a ceramic circuit board in an atmosphere of water vapor containing hydrogen in a ratio of $H_2:H_2O$ $10^{-4}$ to $10^{-6.5}$ by firing a ceramic structure, which comprises copper as a conductor, spodumene or cordierite as a ceramic insulator, polyvinylbutyral as a binder, and dioctyl phthalate or dibutyl phthalate as a plasticizer. However, there is no reference in the description to a deflocculant. In addition, polyvinyl butyral is not thermally depolymerizable and does not completely burn out at a temperature lower than 1000° C. in an non-oxidizing atmosphere. Thus, the inventors consider that of the above fired board will inevitably deteriorate the mechanical and electrical properties due to its porous structure and to residual carbon.

Kamehara et al to Fujitsu Ltd., disclose in U.S. Pat. No. 4,504,339 a method for producing a multilayer glass-ceramic structure having copper-based conductors therein for use as a circuit board. In this method, a multilayer structure consists of layers of a thermally depolymerizable resin and glass-ceramic containing preferably 40 percent to 60 percent by weight of $Al_2O_3$ and layers of a copper-based paste. The structure is fired in an inert atmosphere containing water vapor, the partial pressure of which is 0.005 to 0.3 atmosphere, preferably at 550° C. to 650° C. The structure is then sintered in a nitrogen atmosphere containing no water vapor, preferably at about 900° C.

However, if the firing temperature in the inert atmosphere containing water vapor is higher than 650° C., the residual carbon is trapped in the closed pores in which $H_2O$ vapor is present. The carbon then reacts with the $H_2O$ to form $CO_2$. This phenomenon results in bloating of the glass-ceramic. Thus, Kamehara et al teach the composition of a firing atmosphere and usage of a thermally depolymerizable resin, e.g., polymethyl methacrylate, but do not describe the use of a deflocculant in the organic materials, and a silica rich $SiO_2$-$B_2O_3$ type glass in the ceramics.

A slurry without a deflocculant is generally poor in the dispersion property of ceramic particles in the solvent containing a binder and a plasticizer, and green sheets formed from such a slurry exhibit the same demerit as the slurry. In addition, a fired multilayer structure formed by laminating such green sheets exhibits deviation of the shrinkage rate and the mechanical strength in one and the same structure.

SUMMARY OF THE INVENTION

It is an object of the invention to provide a process for producing a multilayer ceramic circuit board with copper, which exhibits minimum residual carbon in the ceramic without oxidation of the copper conductor.

It is another object of the present invention to provide a process for producing a multilayer ceramic circuit board with copper, which exhibits minimum deviation of the shrinkage rate and the mechanical strength of the ceramic structure.

It is still another object of the present invention to provide a process for producing a multilayer ceramic circuit board with copper by laminating and firing ceramic green sheets which exhibit minimum surface roughness.

It is yet another object of the present invention to provide a process for producing a multilayer ceramic circuit board with copper by laminating and firing ceramic green sheets which were formed by doctoring a ceramic slurry, in which ceramic particles exhibit minimum flocculation.

There is provided according to the present invention a process for producing a multilayer ceramic circuit board with copper comprising the steps of:

forming green sheets by doctoring a slurry which comprises 100 parts by weight of glass ceramic particles, 5 to 20 parts by weight of a thermally depolymerizable resin binder, 2 to 10 parts by weight of a plasticizer, and up to 2 parts by weight of a fatty acid ethylene oxide adduct deflocculant, the glass ceramic comprising 20 to 70% by weight of alumina; and 30 to 80% by weight of $SiO_2$-$B_2O_3$ type glass;

forming via holes through said green sheets;

screen-printing a copper paste on said green sheets;

laminating said green sheets; thereby forming a multilayer structure; and firing said multilayer structure in a nonoxidizable atmosphere.

DESCRIPTION OF THE PREFERRED EMBODIMENTS

For the deflocculants, fatty acid ethylene oxide adducts having relatively small molecular weight of 150 to 800 can be used, due to its solubility in an organic solvent and the flexibility of formed green sheets, preferably unsaturated fatty acid ethylene oxide adducts, most preferably oleic acid ethylene oxide adducts, due to its relatively small molecular weight which leaves only a small amount of residue at heating.

Useful thermally depolymerizable binder resins may be polymethacrylate ester, polytetrafluoroethylene, poly-α-methyl styrene, and the mixture thereof, because these are depolymerized and burn out at a temperature lower than 900° C. in an inert gas containing water vapor, the partial pressure of which is in the range of 0.005 to 0.3 atmospheric pressure. The $SiO_2$-$B_2O_3$ type glass comprises a first component having a softening point higher than the melting point of copper, and as a second component at least one of noncrystallizable and crystallizable glasses having a softening point lower than the melting point of copper.

The noncrystallizable glass may be borosilicate or aluminoborosilicate, and the crystallizable glass may be cordierite or spodumene.

The firing steps may comprise prefiring the multilayer structure in an inert atmosphere containing water vapor, the partial pressure of which is 0.005 to 0.3 atmosphere, first at a temperature of 350° C. to 450° C. whereat the binder resin is thermally depolymerizable, second at a temperature of 650° C. to 900° C. whereat the residual organic substance which did not burn out in the first step reacts with water vapor to be eliminated; and firing the multilayer structure in an inert atmosphere without water vapor at a temperature higher than 950° C. and lower than the melting point of copper.

Fatty acid ethylene oxide adduct deflocculants easily burn out in an inert atmosphere, thereby little residual carbon is left without oxidizing conductor copper in the fired multilayer ceramic circuit board. The obtained ceramic board exhibits excellent electric and mechanical properties for mounting electronic elements. In addition, fatty acid ethylene oxide adduct deflocculants improve uniformity in the distribution of ceramic particles in green sheets, thereby improving uniformity in the bending strength and shrinkage rate of the fired ceramic structure, which meets the requirement of enlarging the size of multilayer ceramic circuit boards. Unsaturated fatty acid ethylene oxide adducts, such as oleic acid ethylene oxide adduct, linolic acid ethylene oxide adduct and linoleic acid ethylene oxide adduct, are, generally, more preferable than saturated fatty acid ethylene oxide adducts, such as stearic acid ethylene oxide adduct, because the former exhibits larger solubility in an organic solvent than the latter. Oleic acid ethylene oxide adduct is most preferable, because this adduct leaves little amount of residue at heating, due to its relatively small molecular weight.

The present invention will be more fully understood from the following examples, in reference to the drawings.

EXAMPLE 1

The burn out characteristics were estimated by referring to various deflocculants, i.e., oleic acid ethylene oxide adduct (1), sorbitan trioleate (2), a phosphate ester (registered trade name "Niko Frontier A 229E" available from Daiichi Kogyo Seiyaku Ltd.) (3), stearic acid amid ethylene oxide adduct (4), and a glycerol ester of a fatty acid (5).

Those deflocculants were heated alone in a nitrogen atmosphere at a heating rate of 10° C./minutes, and the amount of residue was determined by means of differential thermal analysis.

Figure 1:
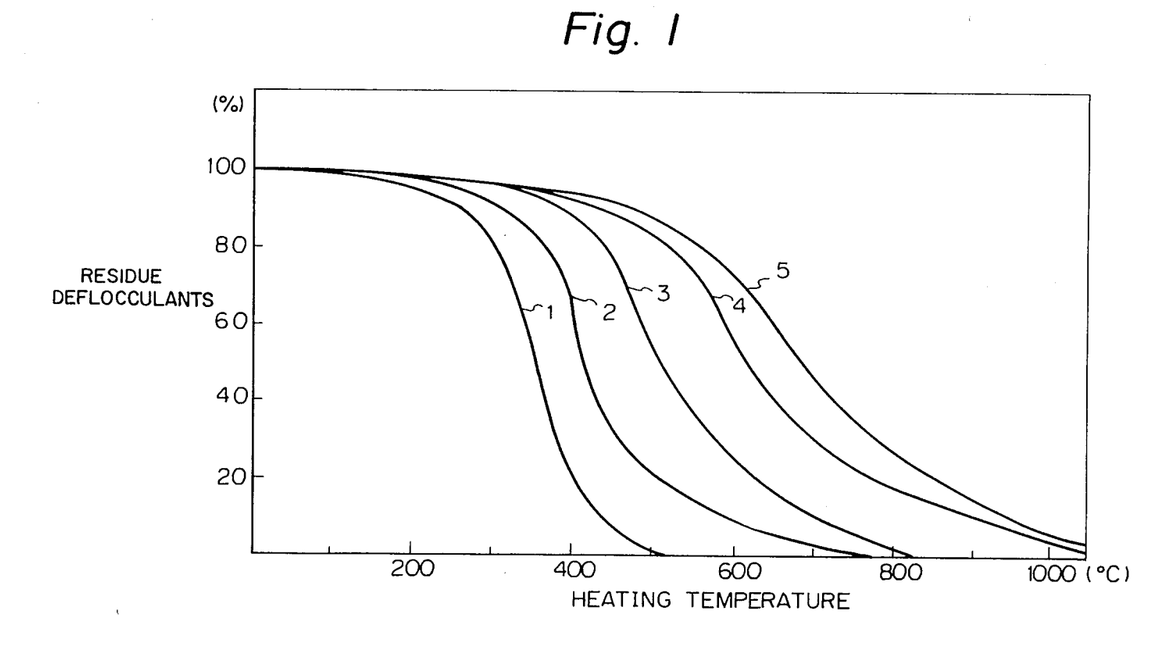
FIG. 1 shows the relationship between the amount of residue of various deflocculants and a heating temperature.

As shown in FIG. 1, oleic acid ethylene oxide adduct (1) exhibits no residue after heating at 500° C. and a fish oil (5) exhibits remaining residue even at 1,000° C.

EXAMPLE 2

Slurries were prepared by mixing the following components in a ball mill for 20 hours.

| Ceramic | 600 g |
| --- | --- |
| α-alumina (diameter 3 to 4 μm) | 200 g |
| Silica-boron oxide type glass A (melting point ca. 1,500° C.) | 200 g |
| Silica-boron oxide type glass B (melting point ca. 800° C.) | 200 g |
| Solvent | 650 g |
| Methyl ethyl ketone | 550 g |
| Acetone | 100 g |
| Binder, polyacrylate | 70 g |
| Plasticizer, dibutyl phthalate | 20 g |
| Deflocculant (molecular weight 480) | 0–12 g |

Figure 2:
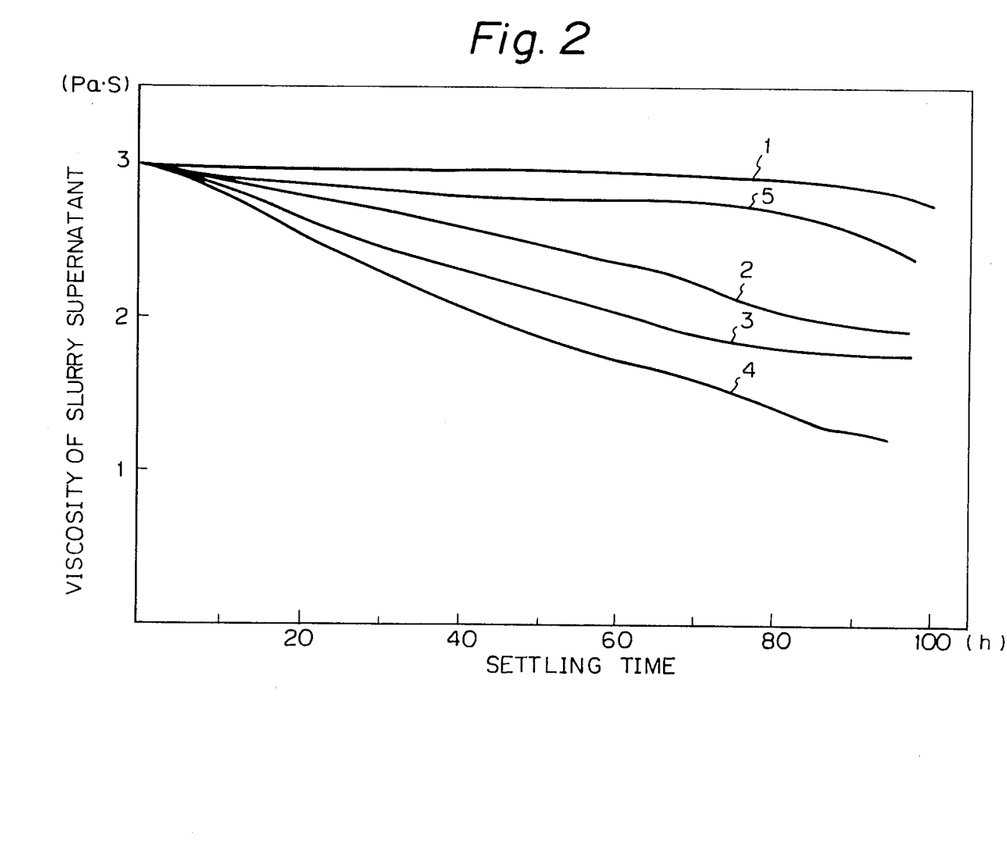
FIG. 2 shows the relationship between the viscosity of supernatant from slurries which contain various deflocculants and a settling time.

The deflocculation characteristics of ceramic slurry, which contained one of the various deflocculants described in Example 1 in an amount of 6 g per 600 g ceramic, i.e., 1.0 part by weight of deflocculant per 100 parts by weight of ceramic, was determined by taking a sample of supernatant flowing from an exit 1.0 cm deep from the surface of the slurry having a total height of 10.0 cm after allowing it to settle for a predetermined period of time, and by measuring the rotation viscosity of the supernatant by a Brookfield viscosimeter. The results are shown in FIG. 2.

The supernatant of a slurry containing oleic acid ethylene oxide adduct (1) maintains its original viscosity after 100 hours of settling, and thus exhibits a dispersion property superior to a slurry containing sorbitan trioleate (2) or a glycerol ester of a fatty acid (5).

EXAMPLE 3

Figure 3:
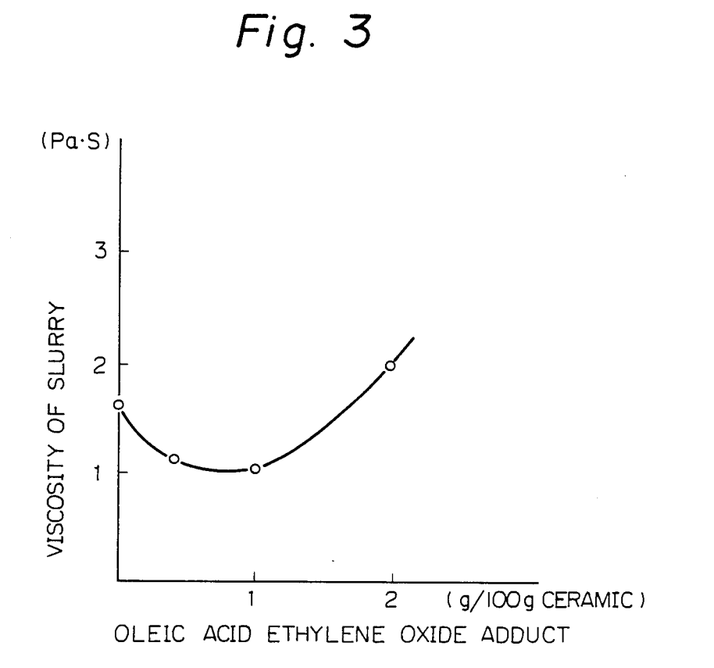
FIG. 3 shows the relationship between the viscosity of slurry and the amount of oleic acid ethylene oxide adduct.

Slurries similar to those described in Example 2, except that the oleic acid ethylene oxide adduct (1) was used alone in an amount of 0 to 12 g per 600 g ceramic, i.e., 0 to 2 parts by weight of deflocculant per 100 parts by weight of ceramic. The rotation viscosity of the sample slurries was determined by a Brookfield viscosimeter immediately after preparation of the slurries. As shown in FIG. 3, the viscosity exhibits minimum value when 0.5 to 2 parts by weight of deflocculant are contained.

EXAMPLE 4

Ceramic green sheets were prepared from slurries similar to those described in Example 2.

Figure 4:
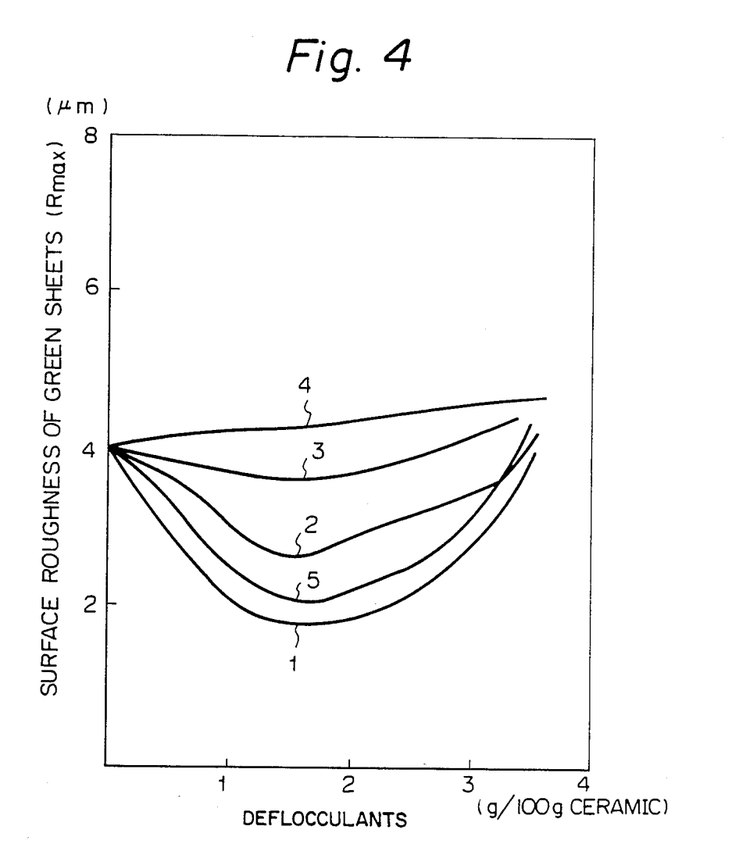
FIG. 4 shows the relationship between the surface roughness of the green sheets and the amount of various deflocculants.

The surface roughness of the ceramic green sheets was determined by a surface roughness contact measuring device. As shown in FIG. 4, the green sheet which contains 1 to 2 parts by weight of oleic acid ethylene oxide adduct (1) per 100 parts by weight of ceramic, i.e., 6 to 12 g per 600 g of ceramic, exhibits minimum surface roughness. Glycerol ester of a fatty acid (5) and sorbitan trioleate (2) exhibit a deflocculating effect similar to polyethylene glycol oleate (1). Conversely, a phosphate ester (3) contributes nothing to defloccuation of the slurry, and stearic acid amid ethylene oxide adduct (4) causes a deterioration in the defloccuation.

EXAMPLE 5

Figure 5A:
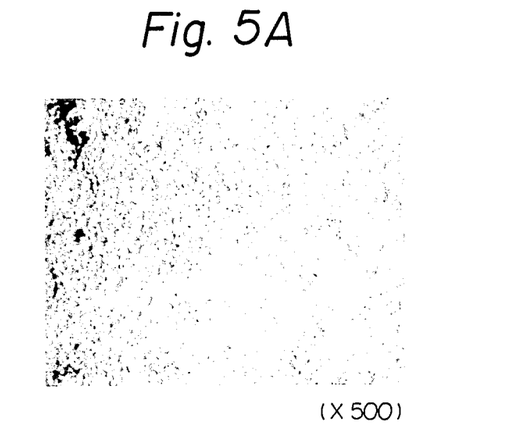
FIGS. 5A and 5B are microphotographs showing the surface of a green sheet which contains oleic acid ethylene oxide adduct.
Figure 5B:
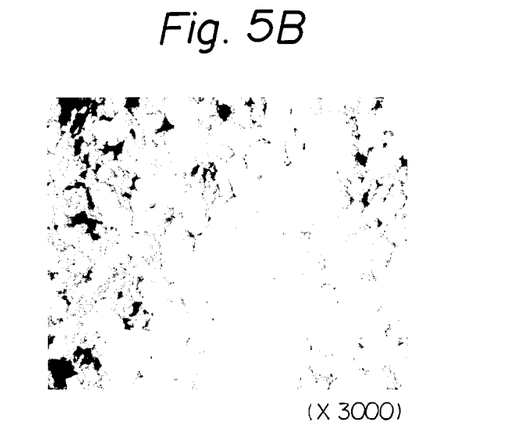
Figure 5C:
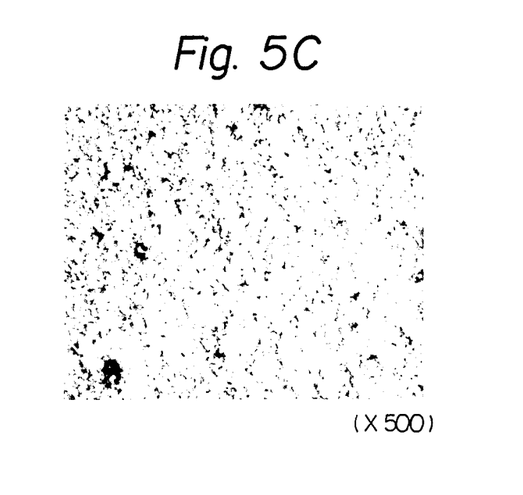
FIGS. 5C and 5D are microphotographs showing the surface of a green sheet which contains no deflocculant.
Figure 5D:
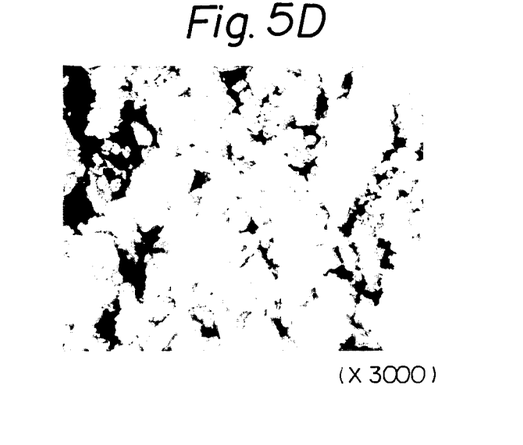

A ceramic green sheet was prepared from a slurry similar to that described in Example 3 except that the amount of oleic acid ethylene oxide adduct (1) was 9 g, i.e., 1.5 parts per weight of deflocculant per 100 parts by weight of ceramic. FIGS. 5A and 5B are microphotographs showing the surface roughness of the ceramic green sheets at magnifications of 500 and 3,000, respectively. FIGS. 5C and 5D are microphotographs similar to those showin in FIGS. 5A and 5B, except that no deflocculant was contained in the green sheets, taken at the same magnifications as in FIGS. 5A and 5B, respectively. The roughness of the green sheets evidently is decreased by adding the oleic acid ethylene oxide adduct (1).

EXAMPLE 6

Figure 6:
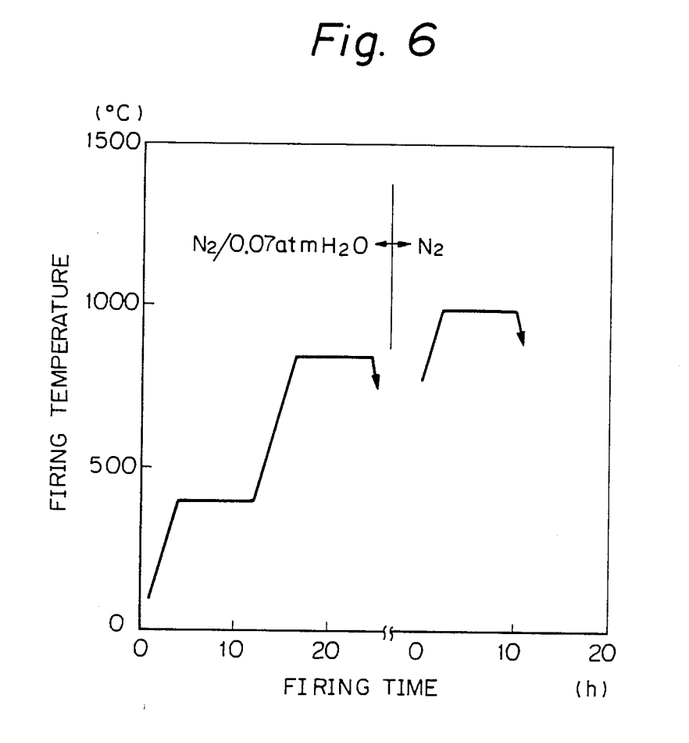
FIG. 6 shows the firing profile for producing a multilayer ceramic circuit board with copper.

Ceramic green sheets were prepared as described in Example 5 to form 0.3×15×15 mm sheets. Copper balls 0.2 mm in diameter were passed through the sheets to form via holes, and patterns of copper paste were screen-printed on the sheets to form conductor patterns. Thirty layers of the thus formed sheets were laminated and pressed under 25 MPa at 130° C. for 30 minutes to form a green multilayer structure, which was subjected to the firing conditions shown in FIG. 6. Thus, prefiring was carried out in a nitrogen atmosphere containing water vapor, the partial pressure of which was 0.07 atmosphere, first at 400° C. for 8 hours, and then at 800° C. for 8 hours, to burn out the organic materials. The prefired multilayer structure was sintered in a nitrogen atmosphere without water vapor at 1,010° C. for 8 hours. The obtained multilayer ceramic circuit board with copper exhibited the following properties. The electric sheet resistance of the copper conductor was 1.1 mΩ/□, the bending strength, the density, the dielectric constant, the amount of residual carbon, and the brighteners of the ceramic insulator were 1,800 kg/cm², 99,0%, 4.9, less than 30 ppm, and 80%, respectively.

EXAMPLE 7

Figure 7:
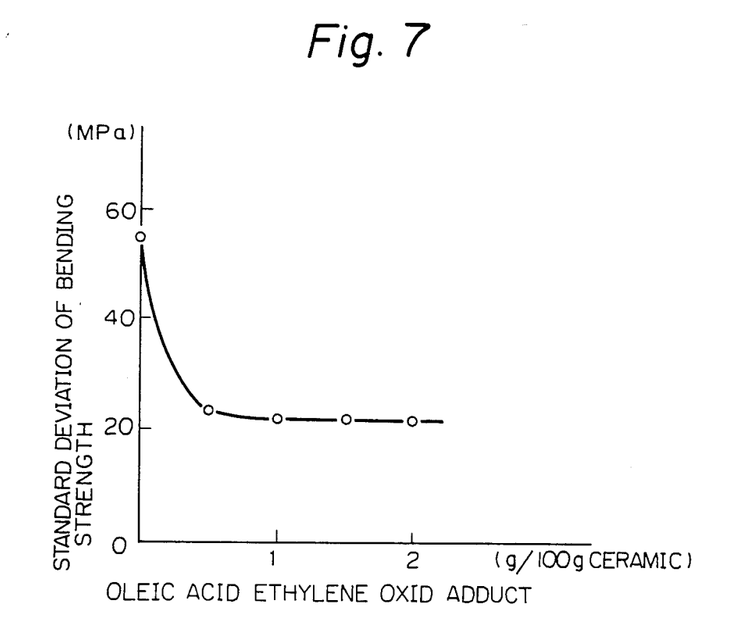
FIG. 7 shows the relationship between the standard deviation of bending strength of fired ceramic substrates and the amount of oleic acid ethylene oxide adduct.

Multilayer ceramic structures were produced similar to those described in Example 6, except that no conductor was contained therein and the amount of oleic acid ethylene oxide adduct (1) was varied to 0 to 2 parts per 100 parts by weight of ceramic. As shown in FIG. 7, the standard deviation of the bending strength between the ceramic structures decreases to near 20 MPa in the case where more than 0.5 parts by weight of oleic acid ethylene oxide adduct was contained.

EXAMPLE 8

Figure 8:
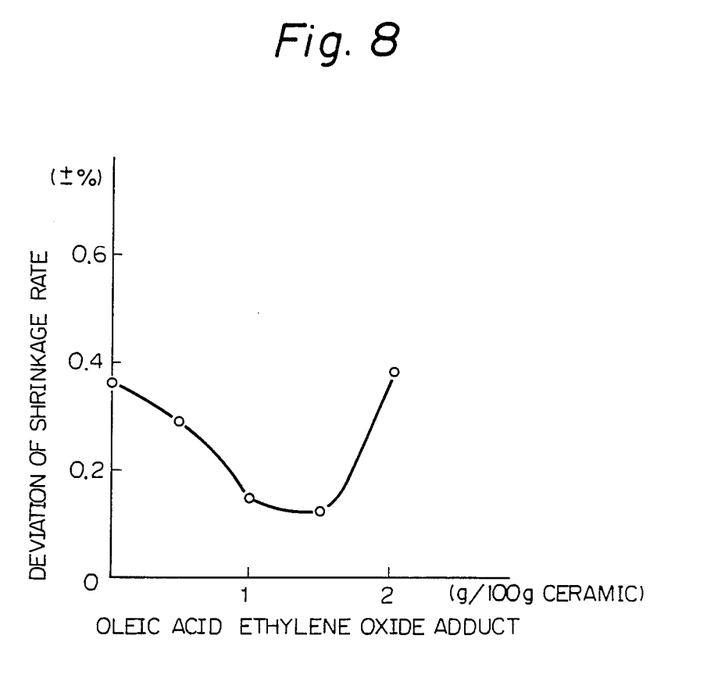
FIG. 8 shows the relationship between the deviation shrinkage rate of a fired ceramic substrate and the amount of oleic acid ethylene oxide adduct.

A multilayer ceramic structure similar those described in Example 7 was subjected to a firing shrinkage test. Deviation of the shrinkage rate in one and the same board was minimum, as shown in FIG. 8, in the case where 0.5 to 2 parts by weight of oleic acid ethylene oxide adduct was contained per 100 parts by weight of ceramic.

What is claimed is:

1. A process for producing a multilayer ceramic circuit board with copper comprising the steps of:
    forming green sheets by doctoring a slurry which comprises 100 parts by weight of glass ceramic particles, 5 to 20 parts by weight of a thermally depolymerizable resin binder, 2 to 10 parts by weight of a plasticizer, and up to 2 parts by weight of a fatty acid ethylene oxide adduct type deflocculant, said glass ceramic comprising 20 to 70% by weight of alumina; and 30 to 80% by weight of $SiO_2$-$B_2O_3$ type glass;

forming via holes through said green sheets;
screen-printing a copper paste on said green sheets;
laminating said green sheets, thereby forming a multilayer structure; and
firing said multilayer structure in a non-oxidizable atmosphere.

2. A process according to claim 1, wherein said deflocculant is a fatty acid ethylene oxide adduct, preferably, an unsaturated fatty acid ethylene oxide adduct, most preferably, oleic acid ethylene oxide adduct.

3. A process according to claim 1, wherein said thermally depolymerizable resin is a polymethacrylate resin, a polytetrafluoroethylene resin, a poly-α-methyl styrene resin or a mixture thereof.

4. A process according to claim 1, wherein said $SiO_2$-$B_2O_3$ type glass consists of a first component having a softening point higher than the melting point of copper, and as a second component at least one of noncrystallizable and crystallizable glasses having a softening point lower than the melting point of copper.

5. A process according to claim 3, wherein said non-crystallizable glass is borosilicate or aluminoborosilicate.

6. A process according to claim 3, wherein said crystallizable glass is cordierite or spodumene.

7. A process according to claim 1, wherein said firing comprises the steps of:
prefiring said multilayer structure in an inert atmosphere containing water vapor, the partial pressure of which is 0.005 to 0.3 atmosphere, first at a temperature of 350° C. to 450° C. where said binder resin thermally depolymerizes, then at a temperature of 650° C. to 900° C. where residual organic substance which was not burnt out in the first step reacts with water vapor to be eliminated; and
firing said multilayer structure in an inert atmosphere without water vapor at a temperature higher than 950° C. and lower than the melting point of copper.

* * * * *

UNITED STATES PATENT AND TRADEMARK OFFICE
CERTIFICATE OF CORRECTION

PATENT NO. : 4,679,320

DATED : July 14, 1987

INVENTOR(S) : Imanaka et al.

It is certified that error appears in the above-identified patent and that said Letters Patent is hereby corrected as shown below:

Front page, [57] ABSTRACT, line 8, "deflorculant should be --deflocculant--.

Col. 2, line 20, "polyvinyl buty-" should be --polyvinylbuty- --;

Col. 6, line 6, "showin" should be --shown--;

line 50, "similar" should be --similar to--.

Signed and Sealed this

Ninth Day of February, 1988

Attest:

DONALD J. QUIGG

Attesting Officer

Commissioner of Patents and Trademarks